(12) United States Patent
Mihara

(10) Patent No.: US 6,788,577 B2
(45) Date of Patent: Sep. 7, 2004

(54) NONVOLATILE SEMICONDUCTOR MEMORY

(75) Inventor: Masaaki Mihara, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/188,082

(22) Filed: Jul. 3, 2002

(65) Prior Publication Data

US 2003/0123289 A1 Jul. 3, 2003

(30) Foreign Application Priority Data

Dec. 28, 2001 (JP) ................................. P2001-401031

(51) Int. Cl.⁷ .......................... G11C 16/04; G11C 16/06
(52) U.S. Cl. ......................... 365/185.18; 365/185.21; 365/185.24
(58) Field of Search ................. 365/185.18, 185.21, 365/185.24

(56) References Cited

U.S. PATENT DOCUMENTS

| | | | | |
|---|---|---|---|---|
| 5,748,534 A | * | 5/1998 | Dunlap et al. | ......... 365/185.21 |
| 5,757,700 A | | 5/1998 | Kobayashi | |
| 5,801,993 A | * | 9/1998 | Choi | ..................... 365/185.28 |
| 5,892,714 A | * | 4/1999 | Choi | ..................... 365/185.24 |
| 5,940,283 A | | 8/1999 | Mihara et al. | ................. 327/80 |
| 5,973,959 A | * | 10/1999 | Gerna et al. | ........... 365/185.21 |
| 6,016,272 A | * | 1/2000 | Gerna et al. | ........... 365/185.21 |
| 6,091,642 A | * | 7/2000 | Pasotti et al. | .......... 365/185.24 |
| 6,094,374 A | * | 7/2000 | Sudo | ..................... 365/185.21 |
| 6,097,639 A | * | 8/2000 | Choi et al. | .............. 365/185.24 |
| 6,111,791 A | * | 8/2000 | Ghilardelli | ............. 365/185.21 |
| 6,269,022 B1 | * | 7/2001 | Ra | ......................... 365/185.24 |
| 6,281,716 B1 | | 8/2001 | Mihara | ....................... 327/80 |

FOREIGN PATENT DOCUMENTS

| | | |
|---|---|---|
| JP | 9-293387 | 11/1997 |
| JP | 10-208489 | 8/1998 |
| JP | 2000-19200 | 1/2000 |
| JP | 2001-15716 | 1/2001 |

* cited by examiner

Primary Examiner—Trong Phan
(74) Attorney, Agent, or Firm—McDermott, Will & Emery (57) ABSTRACT

A nonvolatile semiconductor memory which is provided with a plurality of memory elements each having a control gate and a floating gate such that data is stored by electron injection to the floating gate and electron emission from the floating gate, including an electric current detecting circuit for detecting a drain current supplied to a drain of each of the memory elements and a voltage control circuit for controlling a gate voltage supplied to the control gate of each of the memory elements, in accordance with the drain current detected by the electric current detecting circuit.

5 Claims, 5 Drawing Sheets

NONVOLATILE SEMICONDUCTOR MEMORY

BACKGROUND OF THE INVENTION

1. Field of the Invention

The present invention generally relates to semiconductor memories and more particularly, to a circuit configuration of data write and data erase in a nonvolatile semiconductor memory.

2. Description of the Prior Art

Figure 5:
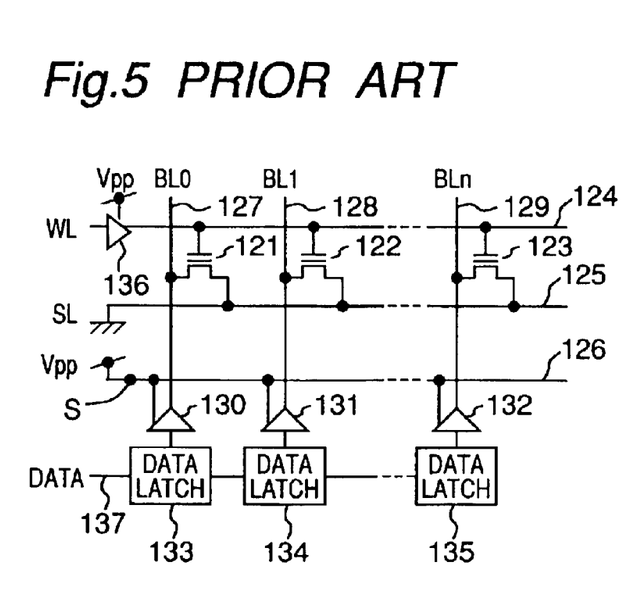
FIG. 5 is a circuit diagram showing memory cells and a peripheral circuit of the memory cells in a conventional EEPROM.

FIG. 5 shows a memory cell circuit of a conventional electrically erasable programmable read-only memory (EEPROM). The conventional memory cell circuit includes memory cells 121 to 123 and a peripheral circuit of the memory cells 121 to 123. The peripheral circuit includes a word line 124, a source line 125, a power line 126, bit lines 127 to 129, bit line drivers 130 to 132, data latch circuits 133 to 135, a word line driver 136 and a data line 137. In FIG. 5, each of the memory cells 121 to 123 is constituted by a metal-oxide-semiconductor (MOS) transistor in which a floating gate is formed on a channel connecting a source and a drain and a control gate for controlling potential of the channel is formed on the floating gate.

The word line 124 is connected to the control gates of the memory cells 121 to 123 and potential of the word line 124 is changed by the word line driver 136. The source line 125 is connected to the sources of the memory cells 121 to 123 and a distal end of the source line 125 is grounded. The bit lines 127 to 129 are, respectively, connected to the drains of the memory cells 121 to 123 such that the memory cells 121 to 123 exchange data with the peripheral circuit via the bit lines 127 to 129. By using a high voltage Vpp supplied through the power line 126, the bit line drivers 130 to 132 apply to the bit lines 127 to 129 outputs corresponding to data of the data latch circuits 133 to 135, respectively. The data line 137 is provided for exchanging data with an external device and connects the data latch circuits 133 to 135 to a data input/output port (not shown) for the external device.

In the conventional EEPROM of FIG. 5, when data is written in one of the memory cells 121 to 123, for example, the memory cell 121, the data is initially latched from the data input/output port to all the data latch circuits 133 to 135 by way of the data line 137. Then, potential of the bit line 127 connected to the memory cell 121 for data write is raised by the bit line driver 130 and potential of the word line 124 is raised by the word line driver 136. In the meantime, since potential of the source line 125 is maintained at a ground level, a high voltage is applied between the source and the drain of the memory cell 121 and hot electrons are generated at the channel by the high electric field. The hot electrons are attracted by the high potential of the floating gate of the memory cell 121 so as to be injected into the floating gate of the memory cell 121 and thus, a gate voltage threshold value at which electric current starts flowing between the source and the drain of the memory cell 121 rises. When the gate voltage threshold value has reached a desired value, the potential of the word line 124 and the potential of the bit line 127 connected to the memory cell 121 for data write are lowered and thus, data write is completed.

In the above described data write operation of the conventional EEPROM, since an initial period required for latching the data is far shorter than a latter period required for raising the gate voltage threshold value of the memory cell to the desired value by generating the hot electrons, the data is simultaneously written in as many memory cells as possible by using such a circuit as shown in FIG. 5, so that write time per unit data quantity is reduced, thereby resulting in improvement of its operating efficiency.

However, in the above conventional EEPROM, as the number of the memory cells for simultaneous data write increases, electric current flowing through the memory cells increases immediately after start of data write and a current peak occurs. Therefore, current carrying capacity of the source line 125 and the power line 126 should be designed to be large in conformity with the current peak. Furthermore, in case the high voltage Vpp supplied to the bit lines 127 to 129 is generated internally, boosting capability of a booster should also be designed to be large in conformity with the current peak. As a result, such a problem arises that these design conditions run counter to recent industrial trends towards miniaturization and lower supply voltage.

Thus, in order to lower the current peak necessary for data write, Japanese Patent Laid-Open Publication No. 2001-15716 (2001) proposes a semiconductor memory unit in which a constant-current element for restricting to a predetermined value electric current supplied to the drains of the memory cells is inserted at a spot S between the power source of the high voltage Vpp and the power line 126 in the conventional EEPROM of FIG. 5. However, electric current supplied to the drains of the memory cells varies due to scatter of characteristics of the memory cells, etc. Therefore, in this known semiconductor memory unit, such inconveniences are incurred that in case the predetermined value to which electric current is restricted by the constant-current element is not optimal, the current peak required for data write cannot be lowered and generation efficiency of the hot electrons cannot be increased.

SUMMARY OF THE INVENTION

Accordingly, an essential object of the present invention is to provide, with a view to eliminating the above mentioned drawbacks of prior art, a nonvolatile semiconductor memory in which not only miniaturization and low supply voltage can be obtained through reduction of current carrying capacity and boosting capability by lowering a current peak required for data write but write time can be shortened by raising generation efficiency of hot electrons.

In order to accomplish this object of the present invention, a nonvolatile semiconductor memory which is provided with a plurality of memory elements each having a control gate and a floating gate such that data is stored by electron injection to the floating gate and electron emission from the floating gate, according to the present invention includes an electric current detecting circuit for detecting a drain current supplied to a drain of each of the memory elements. The nonvolatile semiconductor memory further includes a voltage control circuit for controlling a gate voltage supplied to the control gate of each of the memory elements, in accordance with the drain current detected by the electric current detecting circuit.

BRIEF DESCRIPTION OF THE DRAWINGS

This object and features of the present invention will become apparent from the following description taken in conjunction with the preferred embodiments thereof with reference to the accompanying drawings in which.

Before the description of the present invention proceeds, it is to be noted that like parts are designated by like reference numerals throughout several views of the accompanying drawings.

DETAILED DESCRIPTION OF THE INVENTION

Hereinafter, embodiments of the present invention are described with reference to the drawings.

(First Embodiment)

Figure 1:
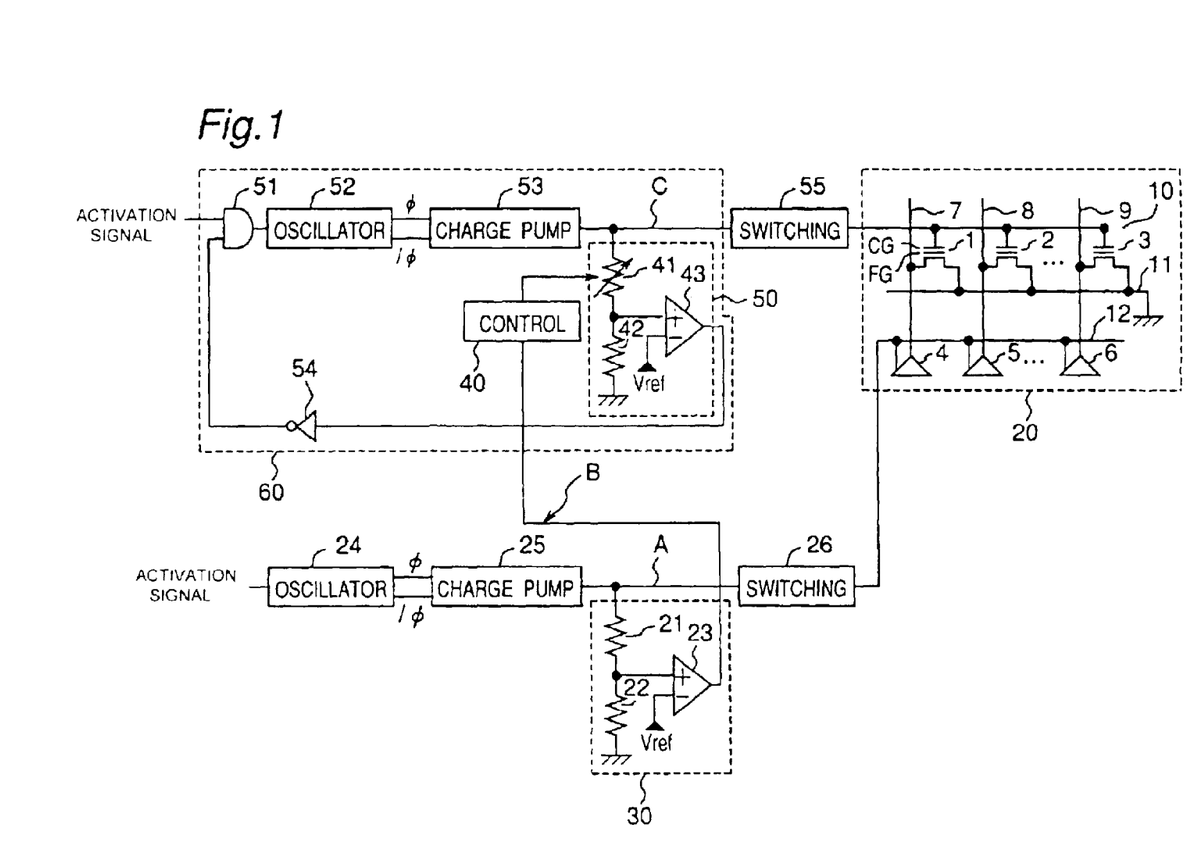
FIG. 1 is a circuit diagram of a nonvolatile semiconductor memory according to a first embodiment of the present invention.

FIG. 1 is a circuit diagram of a nonvolatile semiconductor memory according to a first embodiment of the present invention. This nonvolatile semiconductor memory includes a memory cell circuit 20, a first detection circuit 30, a detection level control circuit 40 and a second detection circuit 50. The memory cell circuit 20, in turn, includes a plurality of, for example, three memory cells 1 to 3 and a peripheral circuit of the memory cells 1 to 3. Each of the memory cells 1 to 3 is constituted by a metal-oxide-semiconductor (MOS) transistor in which a floating gate FG is formed on a channel and a control gate CG for controlling potential of the channel is formed on the floating gate FG. Data is stored by electron injection to the floating gate FG and electron emission from the floating gate FG.

In the memory cell circuit 20, the peripheral circuit includes bit lines 7 to 9 connected to drains of the memory cells 1 to 3, respectively, bit line drivers 4 to 6 connected to the bit lines 7 to 9, respectively, a word line 10 connected to the respective control gates CG of the memory cells 1 to 3, a source line 11 connected to respective sources of the memory cells 1 to 3 and a power line 12 connected to the bit line drivers 4 to 6.

The nonvolatile semiconductor memory further includes a first oscillator 24 activated by an activation signal, a first charge pump circuit 25, a first switching circuit 26, an AND circuit 51, a second oscillator 52, a second charge pump circuit 53, an inverter 54 and a second switching circuit 55. The first oscillator 24, the first charge pump circuit 25 and the first switching circuit 26 are connected to each other in series and the first switching circuit 26 is connected to the power line 12. On the other hand, the AND circuit 51, the second oscillator 52, the second charge pump circuit 53 and the second switching circuit 55 are connected to each other in series and the second switching circuit 55 is connected to the word line 10. In addition, the inverter 54 is connected to one input of the AND circuit 51, and an activation signal is applied to the other.

The first charge pump circuit 25 generates a high voltage in response to clock pulses φ and /φ outputted from the first oscillator 24 and supplies electric current to the drains of the memory cells 1 to 3 via the first switching circuit 26. Bit line drivers 4 to 6 connected to power supply line 12 supply the high voltage to the drain of memory cells 1 to 3 through bit lines 7 to 9. The first detection circuit 30 detects an output voltage of the first charge pump circuit 25 and includes resistance elements 21 and 22 and a comparator 23.

In the configuration of the FIG. 1, as electric current supplied to the drains of the memory cells 1 to 3 increases, the output voltage of the first charge pump circuit 25 drops accordingly. Namely, increase of electric current supplied to the drains of the memory cells 1 to 3 appears as drop of voltage at a supply node A between the first charge pump circuit 25 and the first switching circuit 26. Thus, electric current supplied to the drains of the memory cells 1 to 3 has a corresponding relation with the output voltage of the first charge pump circuit 25. Therefore, by converting into drop of voltage of the supply node A increase of electric current supplied to the drains of the memory cells 1 to 3, the first detection circuit 30 detects the output voltage of the first charge pump circuit 25.

The comparator 23 compares a reference voltage Vref with a potential obtained by subjecting the voltage of the supply node A to resistance division by the resistance elements 21 and 22. If the above potential is higher than the reference voltage Vref, the comparator 23 outputs a high-level detection signal to a node B. On the contrary, if the above potential is lower than the reference voltage Vref, the comparator 23 outputs a low-level detection signal to the node B. Therefore, the detection signal of the first detection circuit 30 is binary. This detection signal of the first detection circuit 30 is inputted to the detection level control circuit 40.

The second charge pump circuit 53 generates a high voltage in response to clock pulses φ and /φ outputted from the second oscillator 52 and supplies voltage to the control gates CG of the memory cells 1 to 3 by way of the second switching circuit 55. The second detection circuit 50 detects an output voltage of the second charge pump circuit 53 and includes a variable resistance circuit 41, a resistance element 42 and a comparator 43. In place of the resistance element 21 of the first detection circuit 30, the second detection circuit 50 includes the variable resistance circuit 41. By changing resistance value of the variable resistance circuit 41 by the detection level control circuit 40, detection level of the output voltage of the second charge pump circuit 53 can be switched.

In FIG. 1, a voltage control circuit 60 for controlling voltage supplied to the control gates CG of the memory cells 1 to 3 is constituted by the detection level control circuit 40, the second detection circuit 50 and the components 51 to 54 which are enclosed by the broken lines. In accordance with the output voltage of the first charge pump circuit 25 detected by the first detection circuit 30, the voltage control circuit 60 controls the voltage supplied to the control gates CG of the memory cells 1 to 3. Meanwhile, as described above, the electric current supplied to the drains of the memory cells 1 to 3 has the corresponding relation with the output voltage of the first charge pump circuit 25. Accordingly, in accordance with the electric current supplied to the drains of the memory cells 1 to 3, the voltage control circuit 60 controls the voltage supplied to the control gates CG of the memory cells 1 to 3.

Figure 2:
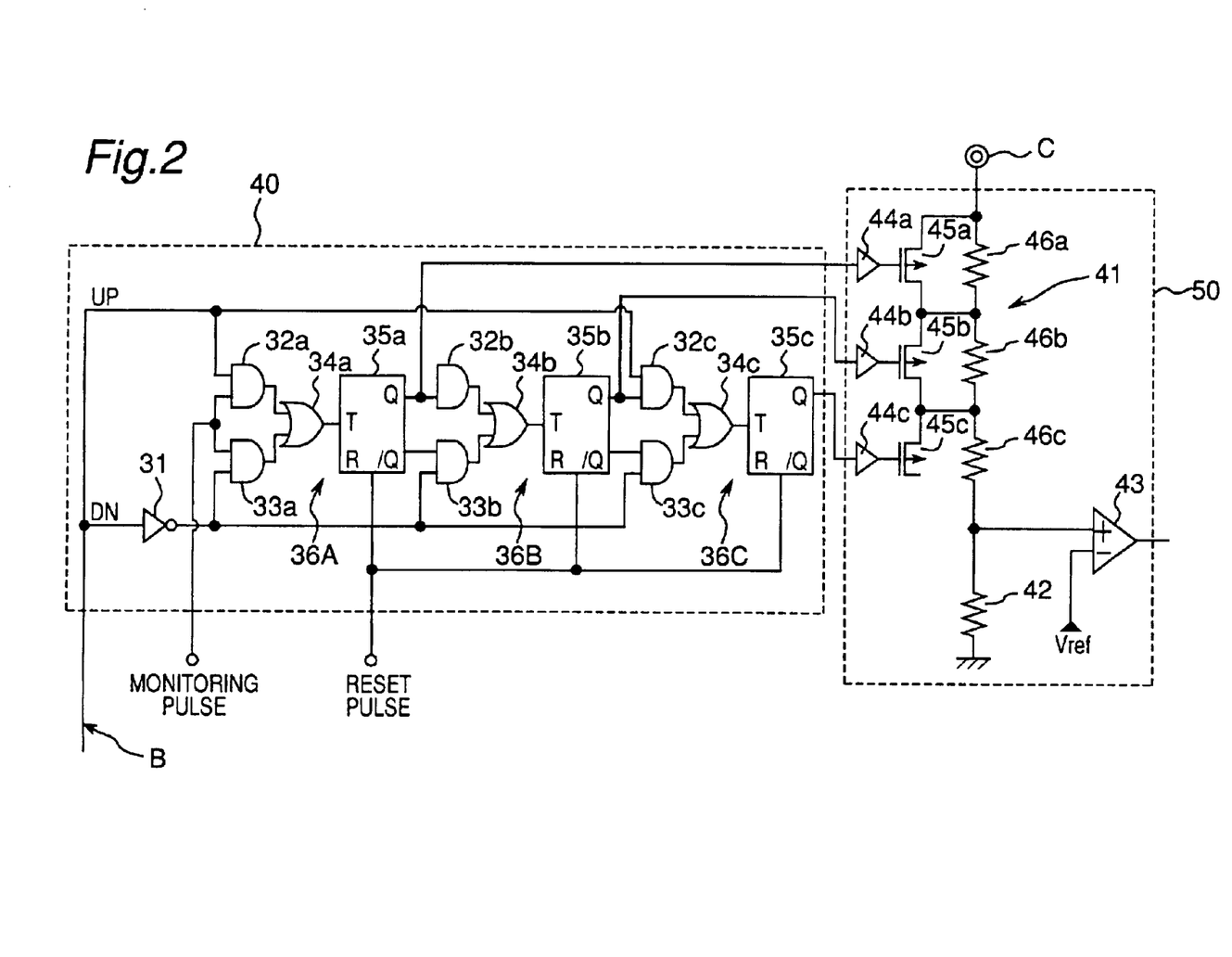
FIG. 2 is a circuit diagram showing configurations of a detection level control circuit and a second detection circuit employed in the nonvolatile semiconductor memory of FIG. 1.

FIG. 2 shows configurations of the detection level control circuit 40 and the variable resistance circuit 41 of the second detection circuit 50 in the nonvolatile semiconductor memory of FIG. 1. The variable resistance circuit 41 includes resistance elements 46a to 46c connected to each other in series, p-channel MOS transistors 45a to 45c connected to the resistance elements 46a to 46c in parallel, respectively and level shifters 44a to 44c connected to gates of the p-channel MOS transistors 45a to 45c, respectively. A high-level input signal of the level shifters 44a to 44c has a supply potential, while a low-level input signal of the level shifters 44a to 44c has a ground potential. On the other hand, a high-level output signal of the level shifters 44a to 44c has a voltage of a node C, while, a low-level output signal of the level shifters 44a to 44c has a ground potential.

Meanwhile, the detection level control circuit 40 incorporates an up-down counter. The up-down counter includes an inverter 31 and three T flip-flop circuits 36A to 36C. The T flip-flop circuit 36A is constituted by AND circuits 32a and 33a, an OR circuit 34a and a T flip-flop 35a. Outputs of the AND circuits 32a and 33a are, respectively, connected to both inputs of the OR circuit 34a and an output of the OR circuit 34a is connected to a T input of the T flip-flop 35a. Likewise, the T flip-flop circuit 36B is constituted by AND circuits 32b and 33b, an OR circuit 34b and a T flip-flop 35b, while the T flip-flop circuit 36C is constituted by AND circuits 32c and 33c, an OR circuit 34c and a T flip-flop 35c. A signal line carrying a reset pulse connects to each T flip-flop 35a, 35b, 35c. The reset pulse is a signal for resetting the detection level control circuit 40 of the T flip-flops so as to set the Q output and the /Q output to low level and high level, respectively, such that a count value of the up-down counter is cleared prior to the application of a voltage thereto.

When the input signal B is at high level, i.e., the supply potential, the up-down counter acts as an up-counter so as to increase a count by one each time a monitoring pulse is received, so that the second detection circuit 50 raises its detection level in response to this output of the up-counter. On the contrary, when the input signal B is at low level, i.e., the ground potential, the up-down counter acts as a down-counter so as to reduce a count by one each time a monitoring pulse is received, so that the second detection circuit 50 lowers its detection level in response to this output of the down-counter.

Meanwhile, in FIG. 2, the up-down counter is employed in the detection level control circuit 40 but may also be replaced by an up-counter or a down-counter. In case the up-counter is employed in the detection level control circuit 40, detection level of the second detection circuit 50 is adapted to only rise. On the other hand, in case the down-counter is employed in the detection level control circuit 40, detection level of the second detection circuit 50 is adapted to only drop.

In this embodiment, since the voltage control circuit 60 controls voltage supplied to the control gates CG of the memory cells 1 to 3, in accordance with electric current supplied to the drains of the memory cells 1 to 3, not only miniaturization and low supply voltage can be obtained through reduction of current carrying capacity and boosting capability by lowering a current peak required for data write but write time can be shortened by raising generation efficiency of hot electrons.

(Second Embodiment)

Figure 3:
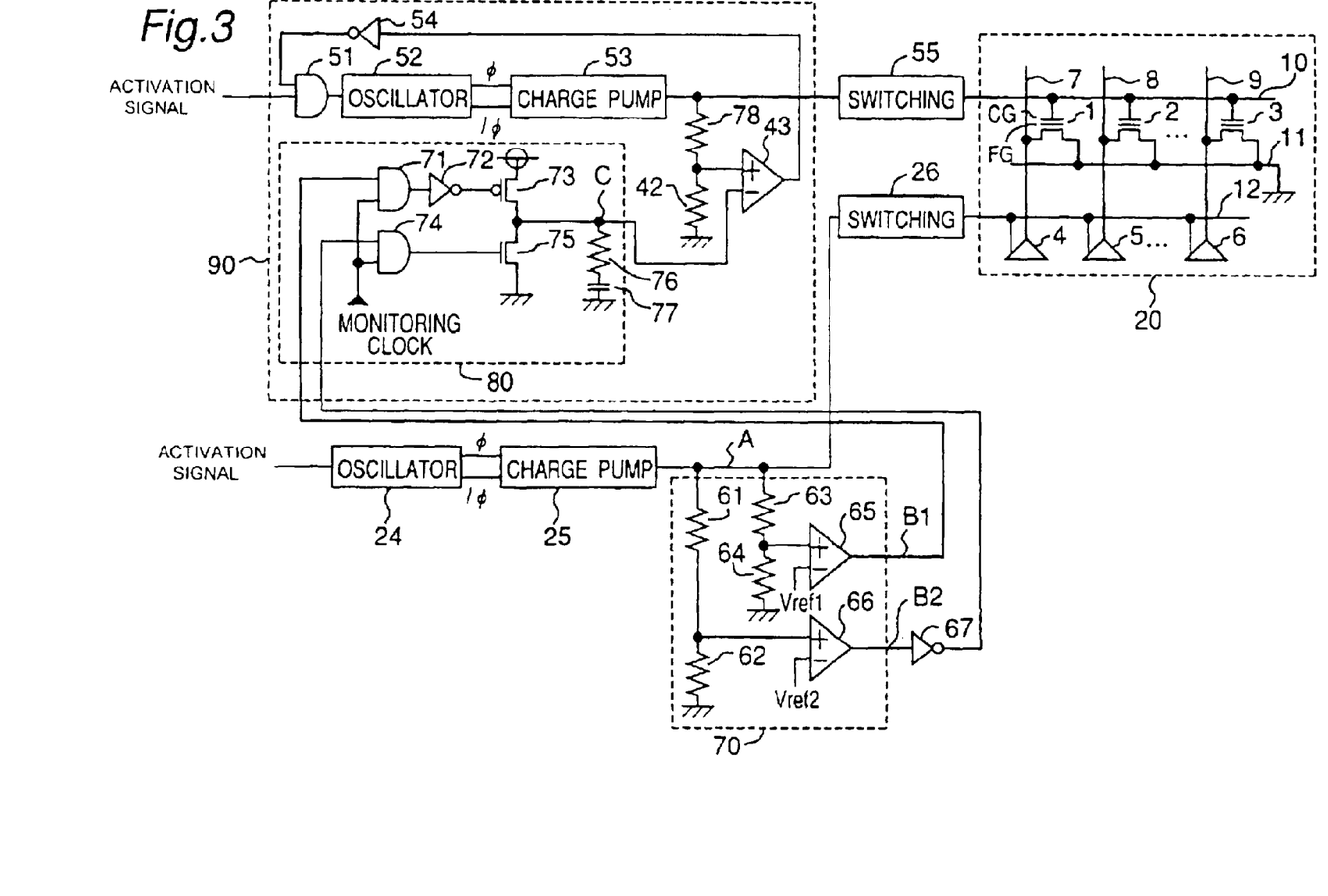
FIG. 3 is a circuit diagram of a nonvolatile semiconductor memory according to a second embodiment of the present invention.

FIG. 3 is a circuit diagram of a nonvolatile semiconductor memory according to a second embodiment of the present invention. This nonvolatile semiconductor memory includes a first detection circuit 70, a resistance element 78 in place of the variable resistance circuit 41 of FIG. 1 and a filter circuit 80. The first detection circuit 70 corresponds to the first detection circuit 30 of FIG. 1, while the resistance elements 78 and 42 and the comparator 43 correspond to the second detection circuit 50 of FIG. 1. Since other configurations of the nonvolatile semiconductor memory are similar to those of the nonvolatile semiconductor memory of the first embodiment, the description is abbreviated for the sake of brevity.

In the same manner as the first embodiment, electric current supplied to the drains of the memory cells 1 to 3 has a corresponding relation with the output voltage of the first charge pump circuit 25. Thus, the first detection circuit 70 detects the output voltage of the first charge pump circuit 25 by converting into drop of voltage of the supply node A increase of electric current supplied to the drains of the memory cells 1 to 3 and includes comparators 65 and 66.

The first detection circuit 70 operates as follows. Namely, the comparator 65 compares a reference voltage Vref1 with a potential obtained by subjecting the voltage of the supply node A to resistance division by resistance elements 63 and 64. If the above potential is higher than the reference voltage Vref1, the comparator 65 outputs a high-level detection signal to a node B1. On the contrary, if the above potential is lower than the reference voltage Vref1, the comparator 65 outputs a low-level detection signal to the node B1. Similarly, the comparator 66 compares a reference voltage Vref2 (Vref2>Vref1) with a potential obtained by subjecting the voltage of the supply node A to resistance division by resistance elements 61 and 62. If the above potential is higher than the reference voltage Vref2, the comparator 66 outputs a high-level detection signal to a node B2. On the other hand, if the above potential is lower than the reference voltage Vref2, the comparator 66 outputs a low-level detection signal to the node B2. Therefore, the detection signal of the first detection circuit 70 is quaternary, i.e., four-valued.

Namely, supposing that character "P" denotes a potential of the node A, both of the nodes B1 and B2 are at high level when the relation of (P>Vref2) is satisfied. When the relation of (Vref2≧P≧Vref1) is satisfied, the node B1 is at high level and the node B2 is at low level. Meanwhile, when the relation of (Vref1>P) is satisfied, both of the nodes B1 and B2 are at low level.

The filter circuit 80 includes an AND circuit 71 for receiving the detection signal of the comparator 65, an inverter 72 for inverting an output signal of the AND circuit 71, a p-channel MOS transistor 73 having a gate for receiving an output signal of the inverter 72 and a source connected to a power source node, an AND circuit 74 for receiving the detection signal of the comparator 66 through an inverter 67, an n-channel MOS transistor 75 having a gate for receiving an output signal of the AND circuit 74 and a source connected to a ground node, a resistance element 76 and a capacitor 77. The AND circuits 71 and 74 receive a monitoring clock.

In the filter circuit 80, when the output signal of the inverter 72 is at low level, the p-channel MOS transistor 73 is turned on and thus, a node C is charged. On the other hand, when the output signal of the AND circuit 74 is at high level, the n-channel MOS transistor 75 is turned on and thus, the node C is discharged. At this time, the output signal of the inverter 72 and the output signal of the AND circuit 74 are pulse signals produced when the monitoring clock is at high level. Therefore, each time the monitoring clock is activated, the node C is charged or discharged in accordance with states of the detection signals of the comparators 65 and 66.

More specifically, when the relation of (P>Vref2) is satisfied by using the above potential P of the node A, level of the node C is raised. When the relation of (Vref2≧P≧Vref1) is satisfied, level of the node C is maintained as it is. Meanwhile, when the relation of (Vref1>P) is satisfied, level of the node C is lowered.

In FIG. 3, a voltage control circuit 90 for controlling voltage supplied to the control gates CG of the memory cells 1 to 3 is constituted by the filter circuit 80 and the components 42, 43, 51–54 and 78 which are enclosed by the broken lines. The voltage control circuit 90 controls voltage supplied to the control gates CG of the memory cells 1 to 3, in accordance with the output voltage of the first charge pump circuit 25, which is detected by the first detection circuit 70. Meanwhile, as described above, electric current supplied to the drains of the memory cells 1 to 3 has a corresponding relation with the output voltage of the first charge pump circuit 25. Therefore, the voltage control circuit 90 controls voltage supplied to the control gates CG of the memory cells 1 to 3, in accordance with electric current supplied to the drains of the memory cells 1 to 3.

In this embodiment, since the voltage control circuit 90 controls voltage supplied to the control gates CG of the memory cells 1 to 3, in accordance with electric current supplied to the drains of the memory cells 1 to 3 in the same manner as the first embodiment, not only miniaturization and low supply voltage can be obtained through reduction of current carrying capacity and boosting capability by lowering a current peak required for data write but write time can be shortened by raising generation efficiency of hot electrons.

(Third Embodiment)

Figure 4:
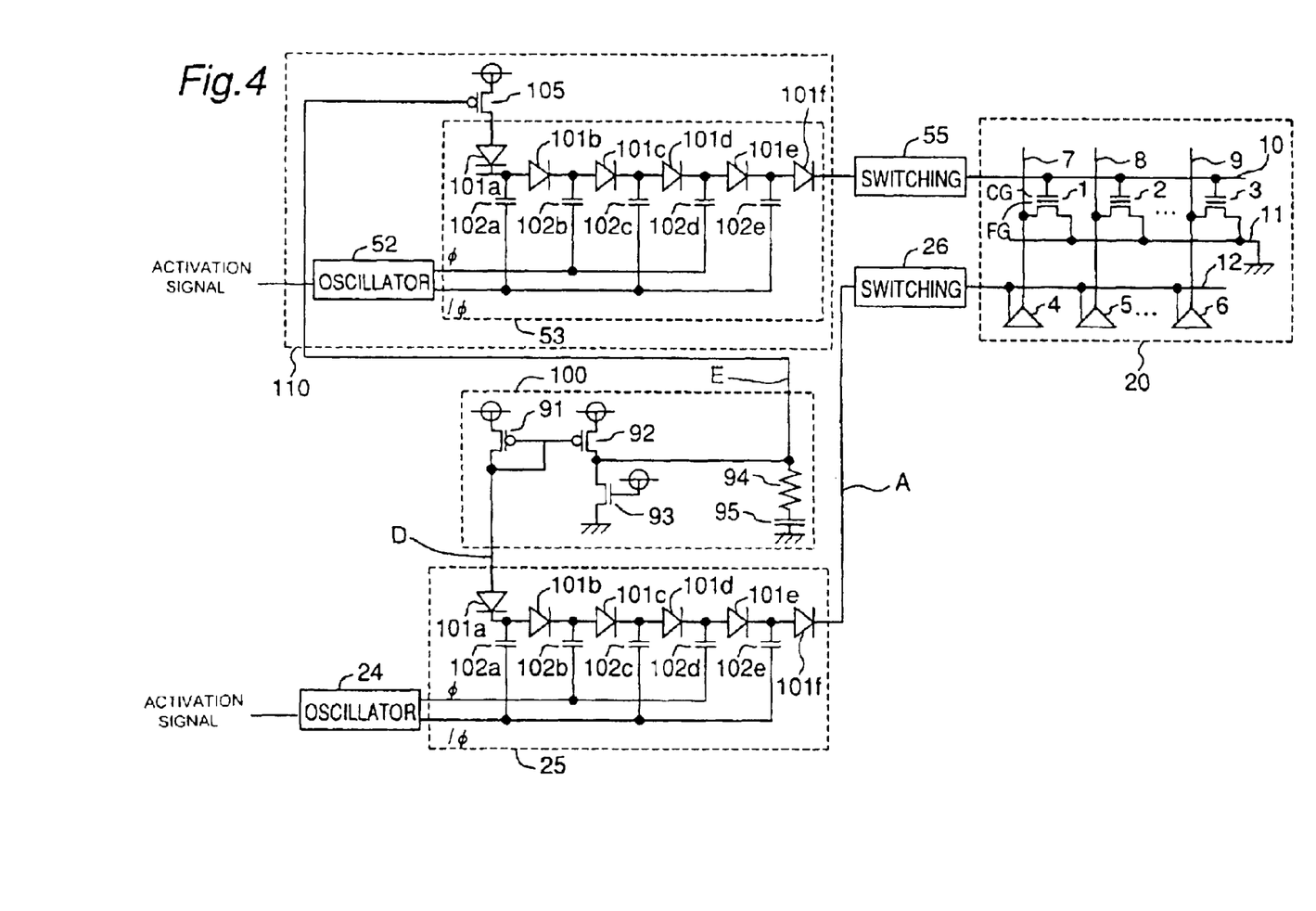
FIG. 4 is a circuit diagram of a nonvolatile semiconductor memory according to a third embodiment of the present invention.

FIG. 4 is a circuit diagram of a nonvolatile semiconductor memory according to a third embodiment of the present invention. This nonvolatile semiconductor memory includes a conversion circuit 100 and a voltage control circuit 110 for controlling voltage supplied to the control gates CG of the memory cells 1 to 3. In FIG. 4, each of the first and second charge pump circuits 25 and 53 includes diodes 101a to 101f and capacitors 102a to 102e. Since other configurations of the nonvolatile semiconductor memory are similar to those of the nonvolatile semiconductor memory of the first embodiment, the description is abbreviated for the sake of brevity.

Electric current supplied to the drains of the memory cells 1 to 3 by the first charge pump circuit 25 is proportional to electric current flowing through a node D. The conversion circuit 100 outputs to a node E a voltage corresponding to electric current flowing through the node D. Thus, electric current supplied to the drains of the memory cells 1 to 3 has a corresponding relation with a voltage outputted to the node E by the conversion circuit 100. The conversion circuit 100 includes p-channel MOS transistors 91 and 92 having gates connected to each other, an n-channel MOS transistor 93 not only having a gate connected to the power source node but connected to the p-channel MOS transistor 92 in series, a resistance element 94 and a capacitor 95. Since a current mirror circuit is constituted by the p-channel MOS transistors 91 and 92, electric current identical with that flowing through the p-channel MOS transistor 91 flows through the p-channel MOS transistor 92.

In the above described configuration of the conversion circuit 100, in case the first charge pump circuit 25 supplies a large quantity of electric current, the voltage of the node E is raised. On the other hand, in case the first charge pump circuit 25 supplies a small quantity of electric current, the voltage of the node E is lowered. Therefore, an output signal of the conversion circuit 100 is an analog signal. This analog signal of the node E is used for adjusting electric current supplied to the second charge pump circuit 53.

In FIG. 4, the voltage control circuit 110 for controlling the voltage supplied to the control gates CG of the memory cells 1 to 3 is constituted by the second oscillator 52, the second charge pump circuit 53 and a p-channel MOS transistor 105 having a gate for receiving the output signal of the conversion circuit 100 and a source connected to the power source node, which are enclosed by the broken lines. The p-channel MOS transistor 105 supplies electric current to the second charge pump circuit 53. The voltage control circuit 110 controls voltage supplied to the control gates CG of the memory cells 1 to 3, in accordance with the voltage outputted to the node E by the conversion circuit 100.

Meanwhile, as described above, since electric current supplied to the drains of the memory cells 1 to 3 has the corresponding relation with the voltage outputted to the node E by the conversion circuit 100. Therefore, the voltage control circuit 110 controls voltage supplied to the control gates CG of the memory cells 1 to 3, in accordance with electric current supplied to the drains of the memory cells 1 to 3.

In this embodiment, since the voltage control circuit 110 controls voltage supplied to the gates of the memory cells 1 to 3, in accordance with electric current supplied to the drains of the memory cells 1 to 3 in the same manner as the first embodiment, not only miniaturization and low supply voltage can be obtained through reduction of current carrying capacity and boosting capability by lowering a current peak required for data write but write time can be shortened by raising generation efficiency of hot electrons.

As is clear from the foregoing description of the nonvolatile semiconductor memory of the present invention, since the nonvolatile semiconductor memory is provided with a plurality of the memory elements each having the control gate and the floating gate such that data is stored by electron injection to the floating gate and electron emission from the floating gate and includes the electric current detecting circuit for detecting the drain current supplied to the drain of each of the memory elements and the voltage control circuit for controlling the gate voltage supplied to the control gate of each of the memory elements, in accordance with the drain current detected by the electric current detecting circuit, the gate voltage is controlled in accordance with the drain current without limiting the drain current to a predetermined value, so that such marked effects are gained that not only miniaturization and low supply voltage can be obtained through reduction of current carrying capacity and boosting capability by lowering the current peak required for data write but write time can be shortened by raising generation efficiency of hot electrons.

What is claimed is:

1. A nonvolatile semiconductor memory for data write and data erase which is provided with a plurality of memory elements each having a control gate and a floating gate such that data is stored by electron injection to the floating gate and electron emission from the floating gate, comprising:

an electric current detecting circuit for detecting a drain current supplied to a drain of each of the memory elements, and for outputting a signal obtained by converting the drain current into a voltage of a node; and a voltage control circuit for controlling a gate voltage supplied to the control gate of each of the memory elements, in accordance with the drain current detected by the electric current detecting circuit, wherein the electric current detecting circuit includes a current mirror circuit for outputting the signal obtained by converting the drain current into a voltage of a predetermined node.

2. A nonvolatile semiconductor memory for data write and data erase which is provided with a plurality of memory elements each having a control gate and a floating gate such that data is stored by electron injection to the floating gate and electron emission from the floating gate, comprising:

an electric current detecting circuit for detecting a drain current supplied to a drain of each of the memory elements, and for outputting a signal obtained by converting the drain current into a voltage of a node; and a voltage control circuit for controlling a gate voltage supplied to the control gate of each of the memory elements, in accordance with the drain current detected by the electric current detecting circuit, wherein the voltage control circuit includes a voltage detecting circuit for detecting the gate voltage and a detection level control circuit for adjusting a detection level of the voltage detecting circuit.

3. The nonvolatile semiconductor memory according to claim 2, wherein the detection level control circuit includes a first member for raising the detection level of the voltage detecting circuit and a second member for lowering the detection level of the voltage detecting circuit.

4. The nonvolatile semiconductor memory according to claim 2, wherein the detection level control circuit includes a first member for raising the detection level of the voltage detecting circuit, a second member for maintaining the detection level of the voltage detecting circuit and a third member for lowering the detection level of the voltage detecting circuit.

5. A nonvolatile semiconductor memory for data write and data erase which is provided with a plurality of memory elements each having a control gate and a floating gate such that data is stored by electron injection to the floating gate and electron emission from the floating gate, comprising:

an electric current detecting circuit for detecting a drain current supplied to a drain of each of the memory elements, and for outputting a signal obtained by converting the drain current into a voltage of a node; and a voltage control circuit for controlling a gate voltage supplied to the control gate of each of the memory elements, in accordance with the drain current detected by the electric current detecting circuit, wherein the voltage control circuit includes a voltage generating circuit for generating the gate voltage and an electric current control circuit for adjusting an electric current supplied to the voltage generating circuit.

* * * * *